United States Patent
Kwon

(10) Patent No.: US 6,924,189 B2
(45) Date of Patent: Aug. 2, 2005

(54) METHOD FOR MANUFACTURING CAPACITOR BOTTOM ELECTRODE OF SEMICONDUCTOR DEVICE

(75) Inventor: Il-Young Kwon, Ichon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/716,424

(22) Filed: Nov. 20, 2003

(65) Prior Publication Data

US 2004/0266102 A1 Dec. 30, 2004

(30) Foreign Application Priority Data

Jun. 25, 2003 (KR) .............................. 10-2003-0041505

(51) Int. Cl.⁷ ......................................... H10L 21/8242
(52) U.S. Cl. ...................... 438/239; 438/210; 438/253; 438/254; 438/396; 438/397
(58) Field of Search ................................ 438/210, 239, 438/253, 254, 396, 397, FOR 212, FOR 220, FOR 430

(56) References Cited

U.S. PATENT DOCUMENTS

| | | | |
|---|---|---|---|
| 6,020,215 A | * | 2/2000 | Yagi et al. ..................... 438/52 |
| 6,436,612 B1 | * | 8/2002 | Chang ......................... 430/316 |
| 6,770,211 B2 | * | 8/2004 | DeBar et al. .................. 216/27 |
| 6,777,759 B1 | * | 8/2004 | Chau et al. .................. 257/377 |
| 2003/0107041 A1 | * | 6/2003 | Tanimoto et al. .............. 257/77 |
| 2003/0203570 A1 | * | 10/2003 | Song et al. .................. 438/254 |
| 2004/0041884 A1 | * | 3/2004 | DeBar et al. ................. 347/55 |
| 2004/0055126 A1 | * | 3/2004 | DeBar et al. .............. 29/25.35 |

* cited by examiner

Primary Examiner—George Fourson
Assistant Examiner—Joannie Adelle Garcia
(74) Attorney, Agent, or Firm—Mayer, Brown, Rowe & Maw LLP

(57) ABSTRACT

A method for manufacturing a capacitor bottom electrode by using low k dielectric material as a sacrificial layer is employed to simplify manufacturing steps and prevent electrical shortage phenomenon of bottom electrodes. The method includes steps of: preparing a semiconductor substrate obtained by a predetermined process; forming a sacrificial layer of low k dielectric material on the semiconductor substrate; forming a photoresist pattern on the sacrificial layer; etching the sacrificial layer by using the photoresist pattern as an etching mask, thereby forming an opening; depositing a conductive layer on sides and a bottom face of the opening and a top face of the sacrificial layer; forming a photoresist on the conductive layer, wherein a concave region of the conductive layer is completely filled with the photoresist; planarizing the conductive layer till a top face of the sacrificial layer is exposed; and forming a bottom electrode by removing the sacrificial layer enclosing the bottom electrode by using $O_2$ plasma and by removing a residual photoresist.

18 Claims, 15 Drawing Sheets

METHOD FOR MANUFACTURING CAPACITOR BOTTOM ELECTRODE OF SEMICONDUCTOR DEVICE

FIELD OF THE INVENTION

The present invention relates to a method for manufacturing a semiconductor device; and, more particularly, to a method for manufacturing a capacitor bottom electrode of the semiconductor device using a dielectric material with a low dielectric constant (low k dielectric) as a sacrificial layer, thereby simplifying a manufacturing process and enhancing a capacitor property.

DESCRIPTION OF THE PRIOR ART

As is well known, a semiconductor device has been down-sized by a scale down of a design rule. Therefore, various researches have been conducted for securing charge storage capacity according to micronization. To fabricate a capacitor with three-dimensional structure such as a concave type and a stack type, is also one of the methods for securing storage capacity.

There are provided in FIGS. 1A to 1G cross sectional views setting forth a conventional method for manufacturing a capacitor bottom electrode with the concave type for use in the semiconductor device.

Referring to FIG. 1A, the conventional method for manufacturing the capacitor bottom electrode begins with preparing a semiconductor substrate 110. Thereafter, a first insulating layer 112 is formed on a top face of the semiconductor substrate 110 and then is patterned into a first predetermined configuration to form a first contact plug 114, wherein the first contact plug 114 is electrically connected to an active area, e.g., source/drain regions of the semiconductor substrate 110 which are not depicted in the drawing for the sake of convenience.

Here, Tetraethyl Ortho Silicate (TEOS) layer is used for the first insulating layer 112 and the first contact plug 114 is polysilicon. On the top face of the first contact plug 114, additionally, a barrier layer (not shown) of $Ti/TiSi_2/TiN$ structure may be formed in order to prevent diffusion phenomenon.

Subsequently, top faces of the first contact plug 114 and the first insulating layer 112 are planarized by using a chemical mechanical polishing (CMP) process. Then, a second insulating layer 116 is formed on planarized top faces of the first contact plug 114 and the first insulating layer 112.

In a next step, bit lines 118 are formed on portions of the second insulating layer 116, wherein the bit lines 118 and the first contact plug 114 are not overlapped each other. Thereafter, an etch stop layer 120 is deposited on exposed surfaces of the bit lines 118 and the second insulating layer 116.

The first etch stop layer 120 plays a role in preventing loss of the bit lines 118 during a post etching process for forming a storage node contact of a capacitor. Especially, a nitride layer such as silicon nitride layer and silicon oxy-nitride layer, can be used as the etch stop layer 120 for securing etching selectivity with respect to a third insulating layer 122, i.e., an oxidation layer.

Next, the third insulating layer 122 is formed on the first etch stop layer 120 and is planarized by using a method such as an etchback process and the CMP process.

Thereafter, a first photoresist layer is formed on the third insulating layer 122 and is patterned into a second predetermined configuration in order to form the storage node contact, thereby obtaining a first photoresist pattern 124 as shown in FIG. 1A.

In an ensuing step, the third insulating layer 122, the first etch stop layer 120 and the second insulating layer 116 are successively patterned into a third predetermined configuration till the top face of the first contact plug 114 is exposed, whereby a contact hole (not shown) is formed. Here, the first etch stop layer 120 and the second insulating layer 116 are etched after the third insulating layer 122 is etched. Thus, a desired etch profile can be achieved by modulating an etching recipe for each etching step.

In a subsequent step as shown in FIG. 1B, plug material such as polysilicon is filled in the contact hole and is planarized by the CMP process so that a second contact plug 126 is formed, wherein the first contact plug 114 and the second, contact plug 126 are electrically connected to each other. Here, the second plug 126 is referred to as the storage node contact.

Referring to FIG. 1C, subsequently, a second etch stop layer 128, e.g., a nitride layer is formed on top faces of the second contact plug 126 and the third insulating layer 122 to prevent a damage of the second plug 126 during a post etching step for forming a capacitor bottom electrode 134. Next, a sacrificial layer 130 is formed on the top face of the second etch stop layer 128 with a predetermined thickness in consideration of the height of the designed capacitor. Then, a second photoresist layer is formed on the sacrificial layer 130 and is patterned into a fourth predetermined configuration so that a second photoresist pattern 136 is formed.

Thereafter, the sacrificial layer 130 is patterned using the second photoresist pattern 136 as an etching mask. A first etching step is carried out till the top face of the second etch stop layer 128 is exposed and a second etching step is carried out till the top face of the second plug 126 is exposed, thereby obtaining an opening 131. Here, polysilicon may be used as a hard mask between the sacrificial layer 130 and the second photoresist pattern 136. Then, the second photoresist pattern 136 is removed as shown in FIG. 1D.

In a next step as shown in FIG. 1E, a conductive layer 132 is deposited over the resultant structure including the opening 131 with uniform thickness so that the conductive layer 132 is electrically connected to the second contact plug 126. After forming the conductive layer 132, a photoresist is deposited to fill a concave part of the conductive layer 132 completely.

In an ensuing step, as shown in FIG. 1F, the conductive layer 132 is planarized using a method such as the etchback process and the CMP process till the top face of the sacrificial layer 130 is exposed, whereby the conductive layer 132 remains only in the concave part thereof.

Subsequently, residuals of the sacrificial layer 130 are cleared off by means of a wet dip-out process using buffered oxide etchant (BOE) or hydrogen fluoride (HF) acid. Thereafter, the residual photoresist layer 134A is removed by means of a dry strip process. That is, the residual photoresist 134A and by-products produced during the etching step are removed by means of rinse of solvent, after the photoresist layer is etched using $O_2/CF_4/H_2O/N_2$ or $O_2/N_2$. Thus, a bottom electrode 132A with a concave type is achieved as shown in FIG. 1G.

In a next step, an annealing process is carried out for recovering a deteriorated characteristic of the bottom electrode 132A incurred during the etching process. Then, residual impurity is removed by a rinse-out process using solution like BOE before forming a dielectric layer on the bottom electrode 132A.

Finally, as not shown in drawings, the dielectric layer and a top electrode are formed on the bottom electrode 132A subsequently, whereby the capacitor is fabricated.

Referring to FIG. 2, there is a plane view of a plurality of the capacitors arranged on the semiconductor substrate 110 according to the conventional method for manufacturing the bottom electrode 132A.

In FIG. 2, a plurality of bottom electrodes 132A are arranged to a predetermined orientation and a plurality of second contact plugs 126 are arranged between bit lines 118 like a matrix. Each bottom electrode 132A is overlapped each second plug 126, wherein each bottom electrode 132A are electrically connected to each second plug 126.

Meanwhile, the bottom electrode 132A is formed by etching the sacrificial layer 130 using a rectangular typed mask or an ellipsoidal typed mask up to date. In this case, there is happened a problem that adjacent bottom electrodes 132A are apt to cling together due to a surface tension of HF acid or BOE solution during the wet dip-out process, thereby incurring an electrical shortage between the adjacent bottom electrodes 132A.

Referring to FIG. 3, there is a cross sectional view setting forth a shortage phenomenon 140 between the adjacent bottom electrodes 132A according to the conventional method for manufacturing the capacitor. As distance (d) between the adjacent bottom electrodes 132A is shortened and an adjacent area increases, the shortage phenomenon 140 is more serious. Furthermore, as the bottom electrode 132A becomes narrow and high, the shortage phenomenon 140 is also happened seriously.

Additionally, as a vertical dimension of the capacitor increases, a process margin decreases due to a gap-fill property while forming a metal contact and a barrier layer, thereby increasing contact resistance in the long run. According to the prior art method, the process for forming the bottom electrode 132A is so complicated, to thereby increase a manufacturing cost. That is, in order to form the bottom electrode 132A in the prior art, it is necessary to carry out a series of process for forming the etch stop layer, the polysilicon grain (PSG) layer, a plasma enhanced TEOS (PE-TEOS) layer, the hard mask and the photoresist layer. Therefore, in order to reduce the manufacturing cost, it should be necessary to solve the shortage problem 140 between the adjacent bottom electrodes 132A and to simplify the manufacturing process.

SUMMARY OF THE INVENTION

It is, therefore, an object of the present invention to provide a method for manufacturing a capacitor bottom electrode of the semiconductor memory device using a low k dielectric layer as a sacrificial layer, thereby simplifying manufacturing process and enhancing a capacitor property.

In accordance with one aspect of the present invention, there is provided a method for manufacturing a capacitor bottom electrode of a semiconductor device, the method including the steps of: a) preparing a semiconductor substrate obtained by a predetermined process; b) forming a sacrificial layer of low k dielectric material on the semiconductor substrate; c) forming a photoresist pattern on the sacrificial layer; d) etching the sacrificial layer by using the photoresist pattern as an etching mask, thereby forming an opening; e) depositing a conductive layer on sides and a bottom face of the opening and a top face of the sacrificial layer; f) forming a photoresist on the conductive layer, wherein a concave region of the conductive layer is completely filled with the photoresist; g) planarizing the conductive layer till a top face of the sacrificial layer is exposed; and h) forming a bottom electrode by removing the sacrificial layer enclosing the bottom electrode by using $O_2$ plasma and by removing a residual photoresist.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 4A to 4G cross sectional views setting forth a method for manufacturing a capacitor bottom electrode with a concave type for use in a capacitor in accordance with a preferred embodiment of the present invention.

Figure 1A:
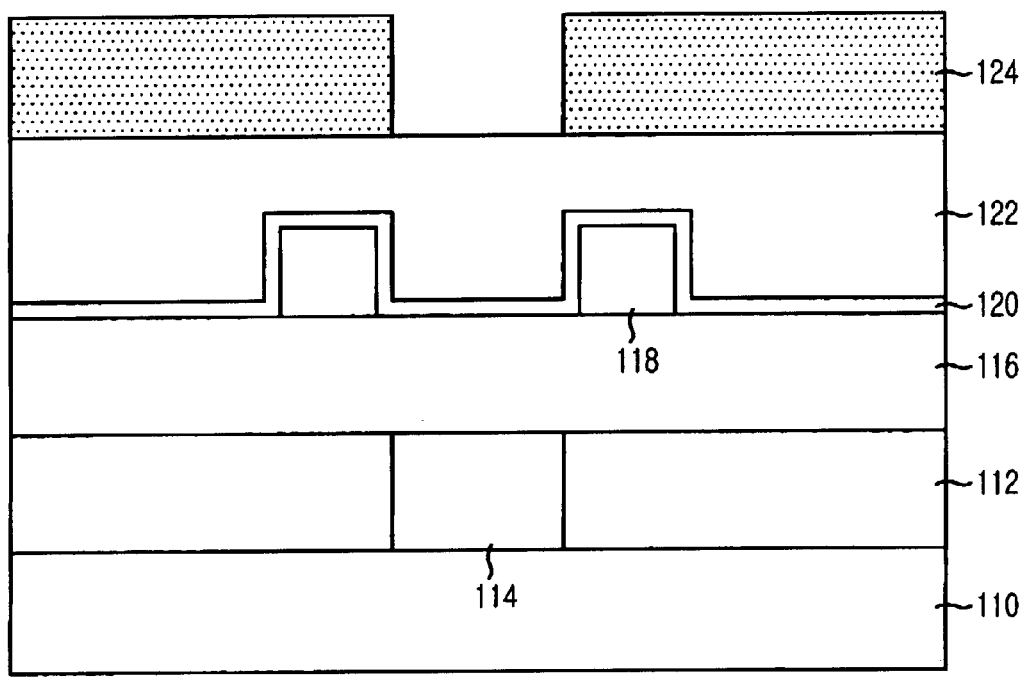
FIGS. 1A to 1G are cross sectional views setting forth a conventional method for manufacturing a bottom electrode with a concave type for use in a semiconductor device.
Figure 1B:
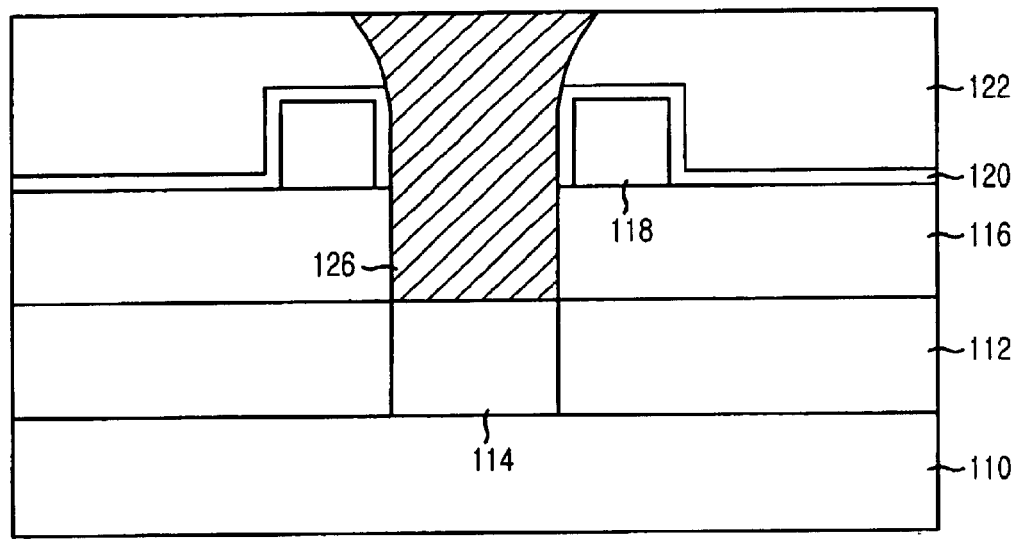
Figure 1C:
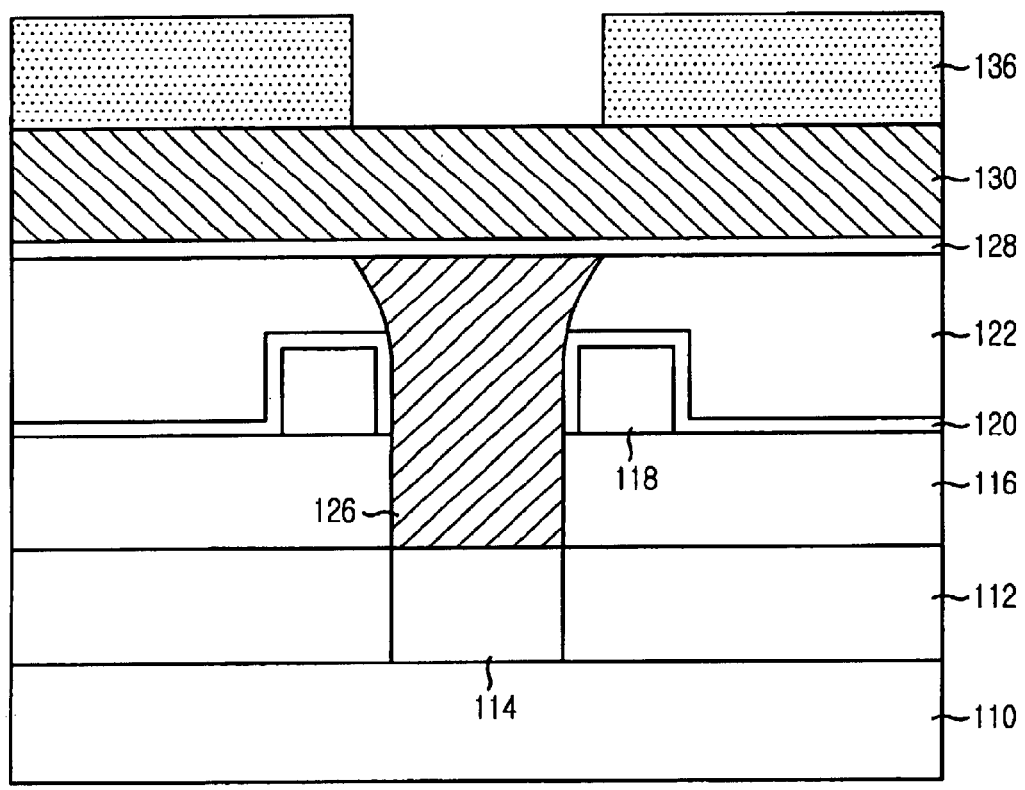
Figure 1D:
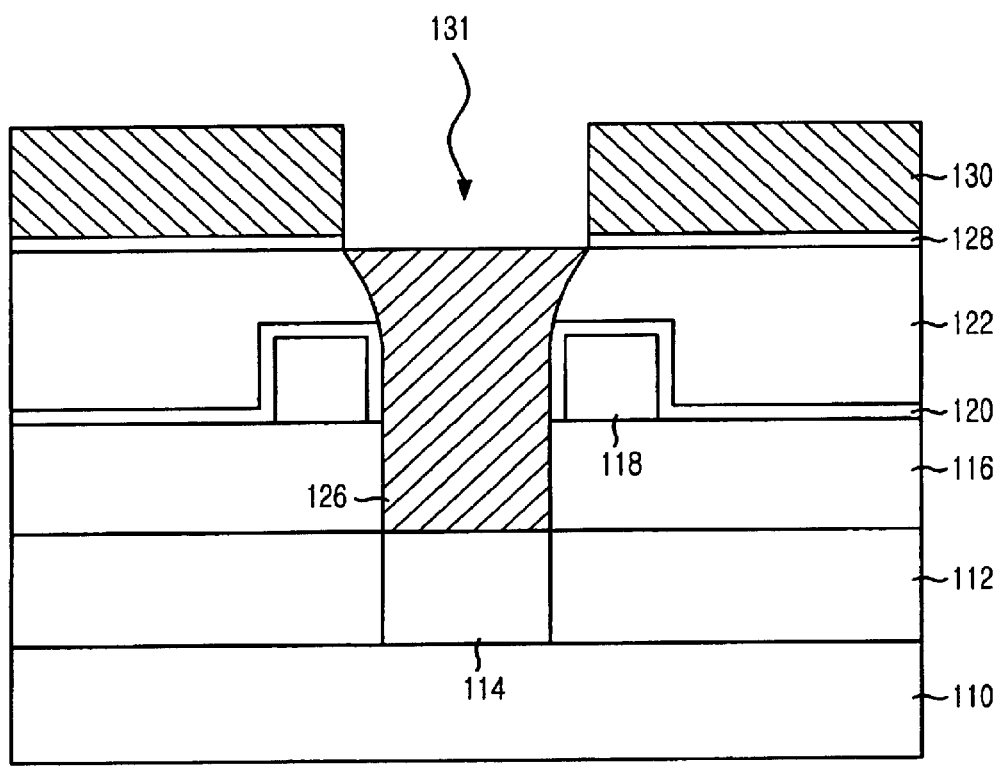
Figure 1E:
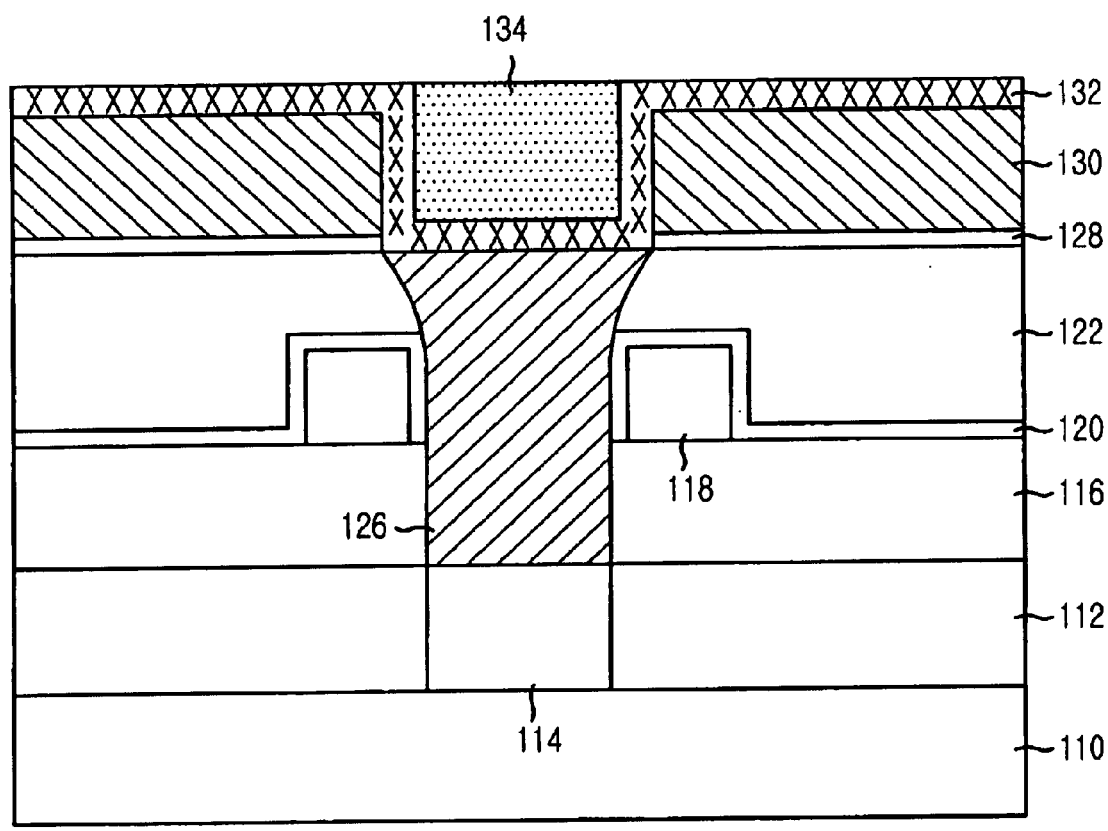
Figure 1F:
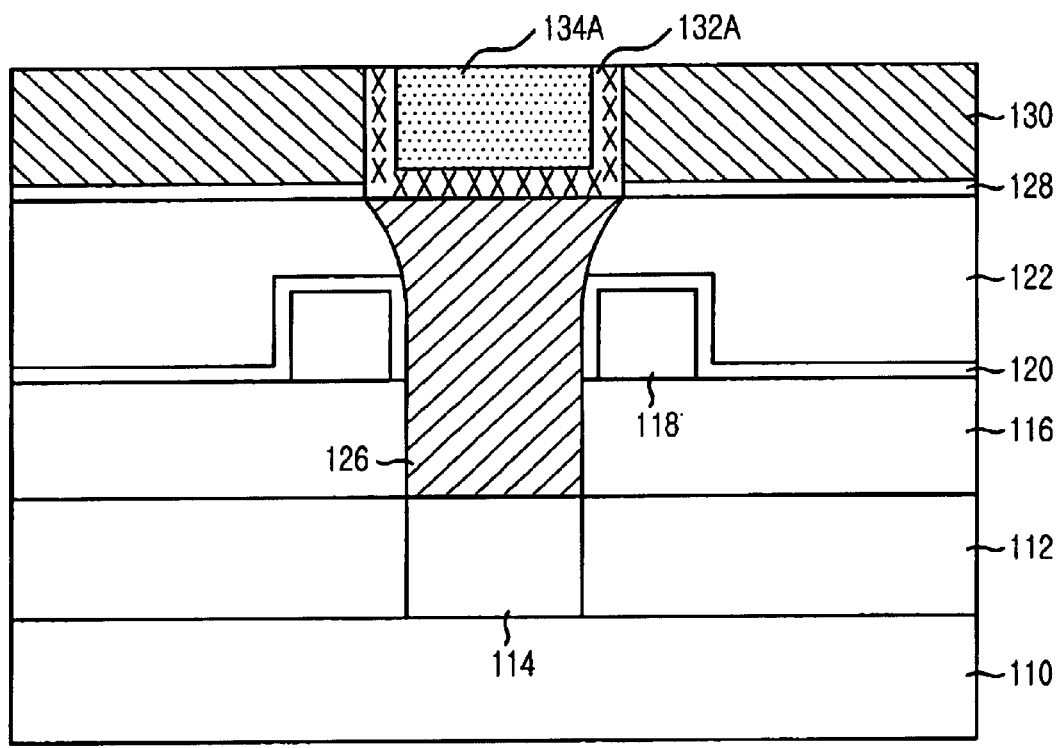
Figure 1G:
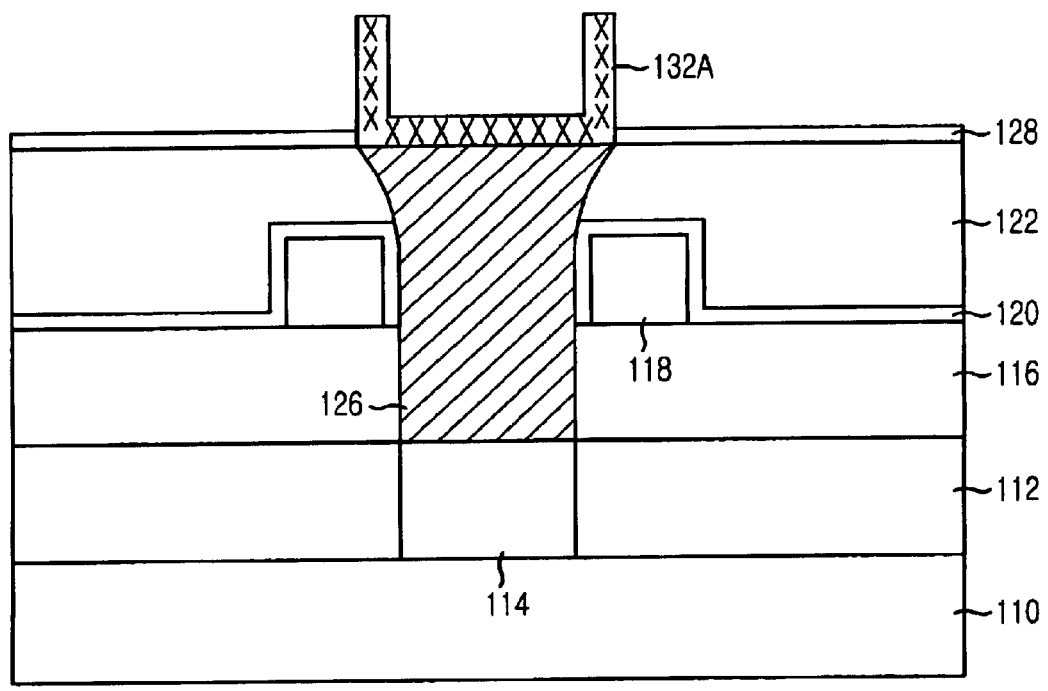
Figure 2:
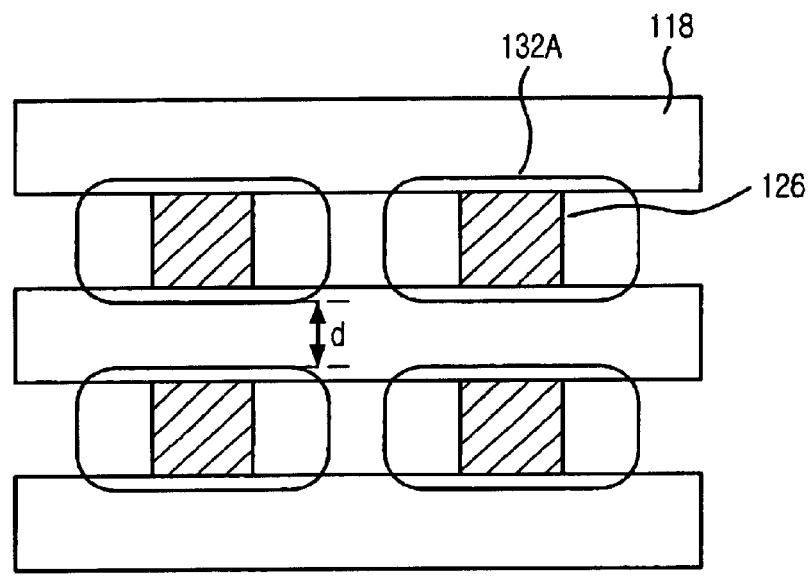
FIG. 2 is a plane view of a plurality of the capacitors arranged on a semiconductor substrate according to the conventional method for manufacturing the bottom electrode with the concave type.
Figure 3:
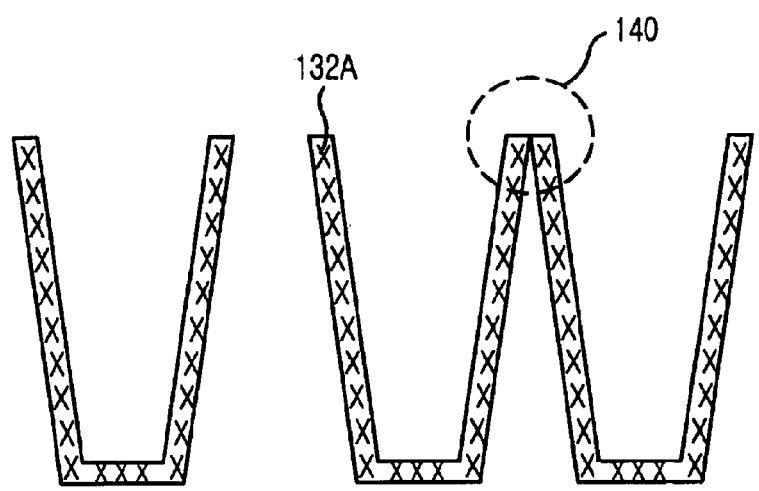
FIG. 3 is a cross sectional view setting forth a shortage phenomenon between adjacent bottom electrodes of the conventional method.
Figure 4A:
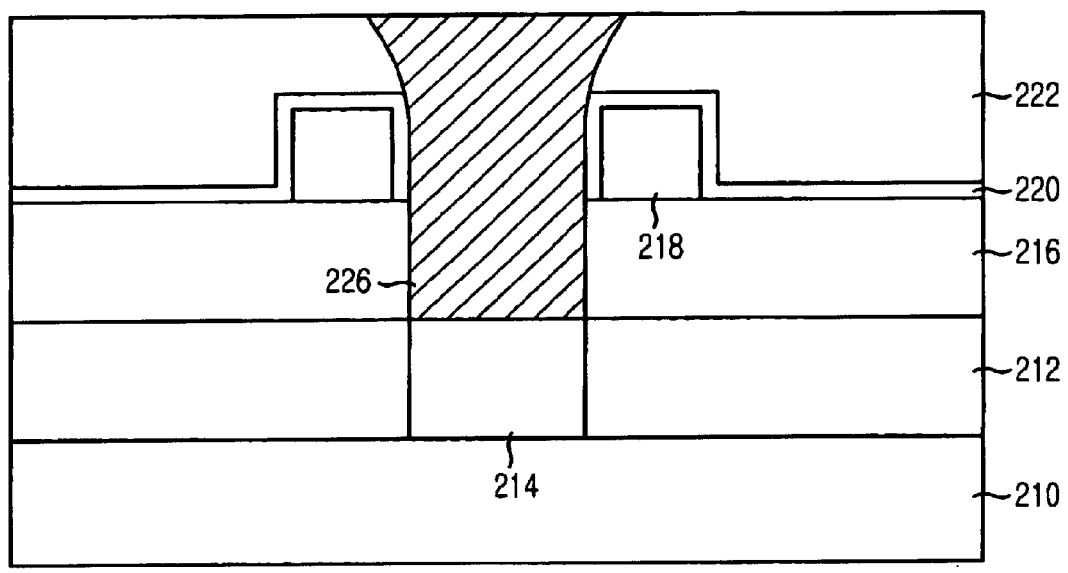
FIGS. 4A to 4G are cross sectional views setting forth a method for manufacturing the bottom electrode with the concave type in accordance with a preferred embodiment of the present invention.

Referring to FIG. 4A, the inventive method for manufacturing the bottom electrode begins with preparation of a semiconductor substrate 210. Thereafter, a first insulating layer 212 is formed on a top face of the semiconductor substrate 210 and then, is patterned into a first predetermined configuration to form a first contact plug 214, wherein the first contact plug 214 is electrically connected to source/drain regions of the semiconductor substrate 210 which are shown in the drawing.

Here, Tetraethyl Ortho Silicate (TEOS) layer is used for the first insulating layer 212 and the first contact plug 214 is polysilicon. On the top face of the first contact plug 214, additionally, a barrier layer (not shown) of Ti/TiSi$_2$/TiN or Ti/TiN structure can be formed in order to prevent diffusion phenomenon.

Subsequently, top faces of the first contact plug 214 and the first insulating layer 212 are planarized by using a chemical mechanical polishing (CMP) process. Then, a second insulating layer 216 is formed on planarized top faces of the first contact plug 214 and the first insulating layer 212.

In a next step, bit lines 218 are formed on portions of the second insulating layer 216, wherein the bit lines 218 and the first contact plug 214 are not overlapped each other. Thereafter, an etch stop layer 220 such as a nitride layer is deposited on exposed surfaces of the bit lines 218 and the second insulating layer 216.

The etch stop layer 220 plays a role in preventing loss of the bit lines 218 during a post etching process for forming a storage node contact of a capacitor. Especially, the nitride layer such as a silicon nitride layer and an silicon oxy-nitride layer, can be used as the etch stop layer 220 for securing etching selectivity with respect to a third insulating layer 222, i.e., an oxidation layer.

Next, the third insulating layer 222 is formed on the etch stop layer 220 and is planarized by using a method such as an etchback process and the CMP process.

Thereafter, a first photoresist pattern (not shown) is formed predetermined top faces of the third insulating layer 222. Then, the third insulating layer 222, the first etch stop layer 220 and the second insulating layer 216 are successively patterned into a third predetermined configuration using the first photoresist pattern as a mask till the top face of the first contact plug 114 is exposed, whereby a contact hole (not shown) is formed. Namely, the third insulating layer 222 is etched till the top face of the etch stop layer 220 is exposed and then the etch stop layer 220 and the second insulating layer 216 are etched, thereby obtaining a desired vertical etching profile.

In a subsequent step, conductive material such as polysilicon is filled in the contact hole and is planarized by the CMP process so that a second contact plug 226 is formed, wherein the first contact plug 214 and the second contact-plug 226 are electrically connected to each other. Here, the second plug 226 is referred to as the storage node contact.

Figure 4B:
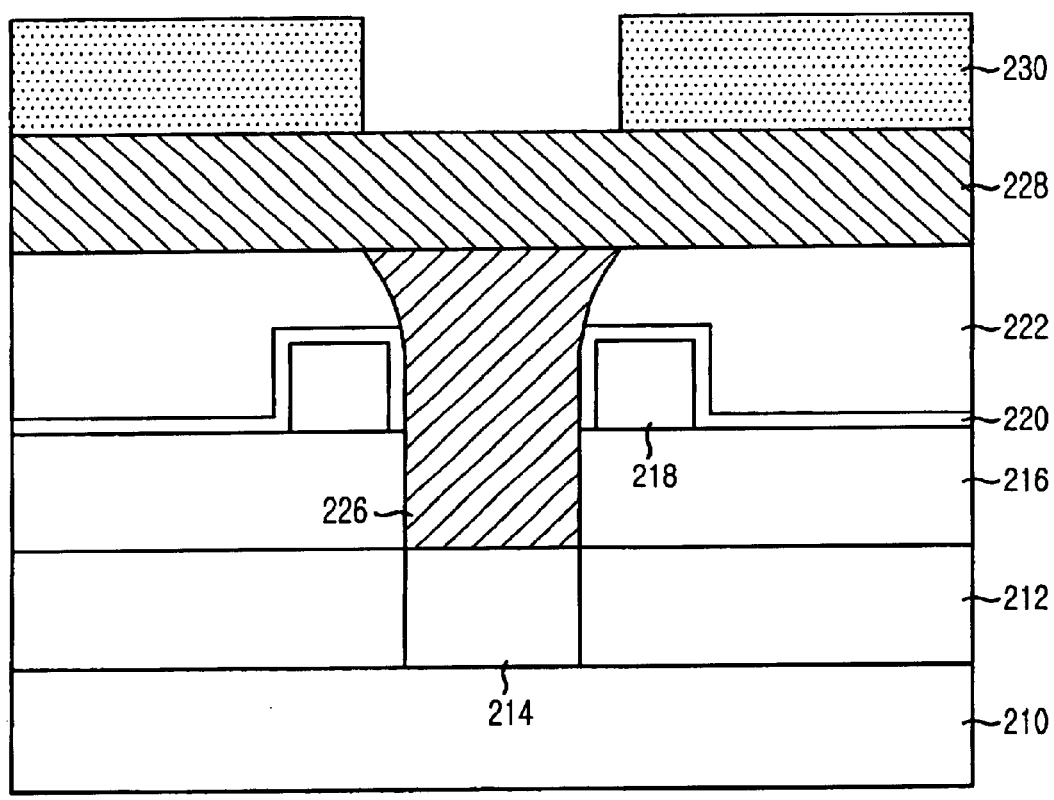

Subsequently, a sacrificial layer 228 is formed on the second contact plug 226 with a predetermined thickness in consideration of the height of the designed capacitor. Here, the inventive method employs an organic material or an inorganic material with low dielectric constant, i.e., low k, as the sacrificial layer 228. Then, a second photoresist layer is formed on the sacrificial layer 228 and is patterned into a fourth predetermined configuration so that a second photoresist pattern 230 is formed as shown in FIG. 4B.

Figure 4C:
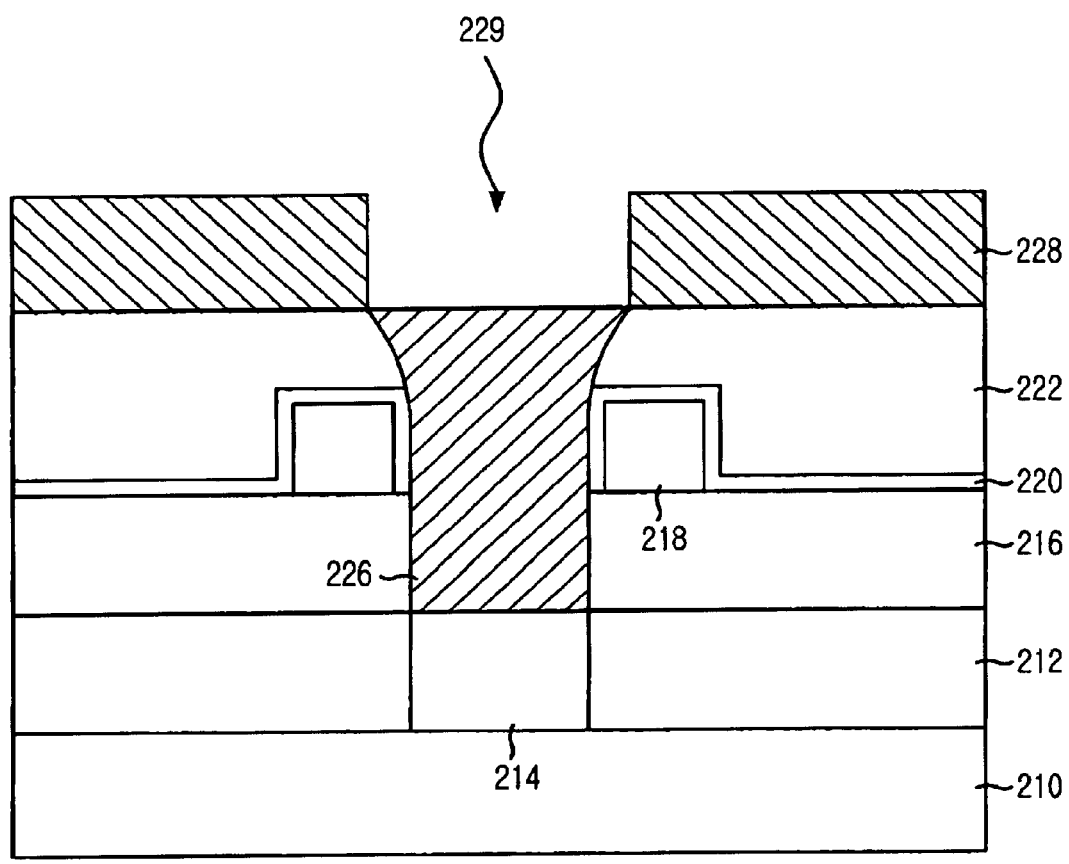

Thereafter, referring to FIG. 4C, the sacrificial layer 228 is patterned by using the second photoresist pattern 230 as the mask. That is, the sacrificial layer 228 is etched making use of the photoresist pattern 230 as an etching mask till the top face of the second contact plug 226 is exposed, whereby an opening 229 is obtained. In an ensuing step, the photoresist pattern 230 is removed through a photoresist strip process.

In order to obtain a vertical profile of the etched section, it is preferable that it should be to use hydro-carbon gas such as $N_2$ and $C_2H_4$ or hydro-fluoro gas such as $C_4F_8$, $C_5F_8$ and $C_4F_6$. In addition, it is preferable to add small amount of oxygen gas for obtaining etching selectivity with respect to the second photoresist pattern 230.

Figure 4D:
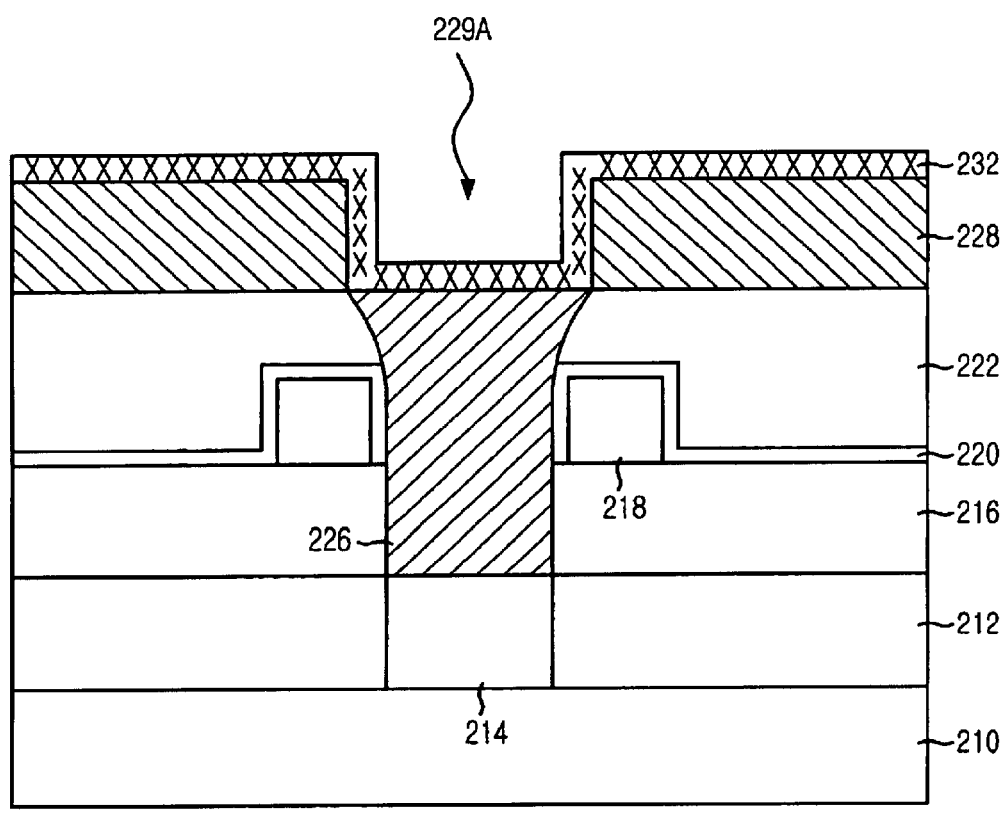

Subsequently, a conductive layer 232 is deposited over the resultant structure including the opening 229 with uniform thickness, wherein the conductive layer 232 and the second contact plug 226 are electrically connected to each other, as shown in FIG. 4D.

Figure 4E:
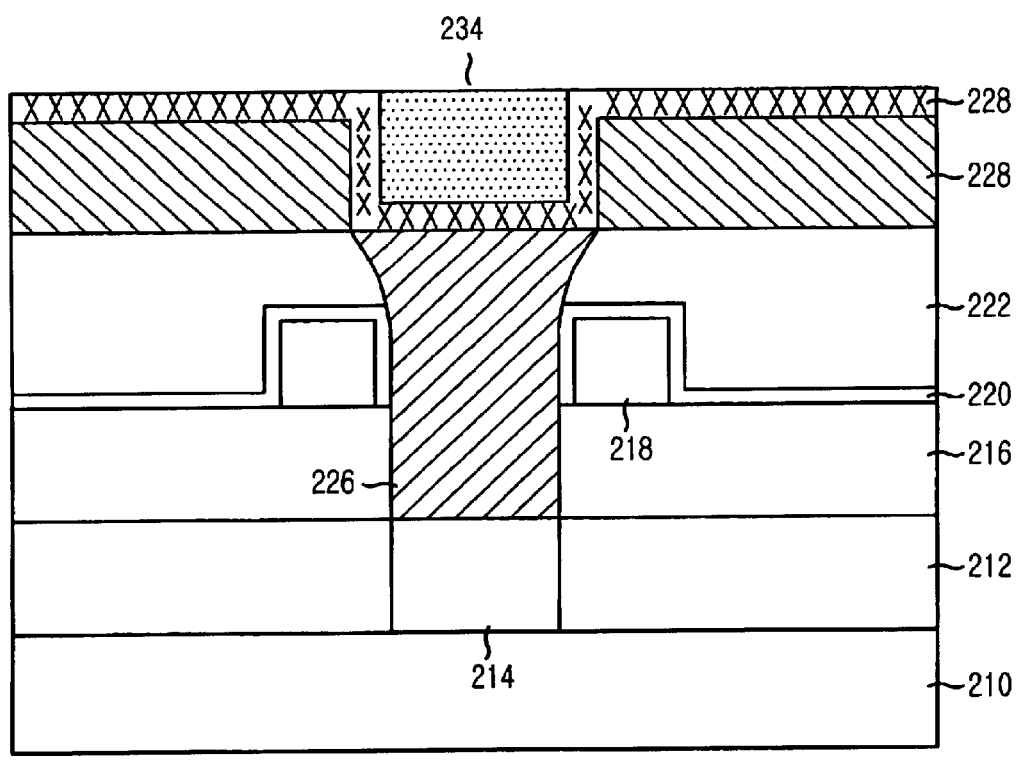

In a next step as shown in FIG. 4E, photoresist material is filled in a concave region 229A of the conductive layer 232. It is preferable that the material for use in the conductive layer 232 should be selected from the group consisting of polysilicon, tungsten, titanium nitride (TiN), tungsten silicide and the combination thereof, by using an atomic layer deposition (ALD) method. In the conventional method, polysilicon is used for the conductive layer 232, which is deposited using a conventional furnace.

Figure 4F:
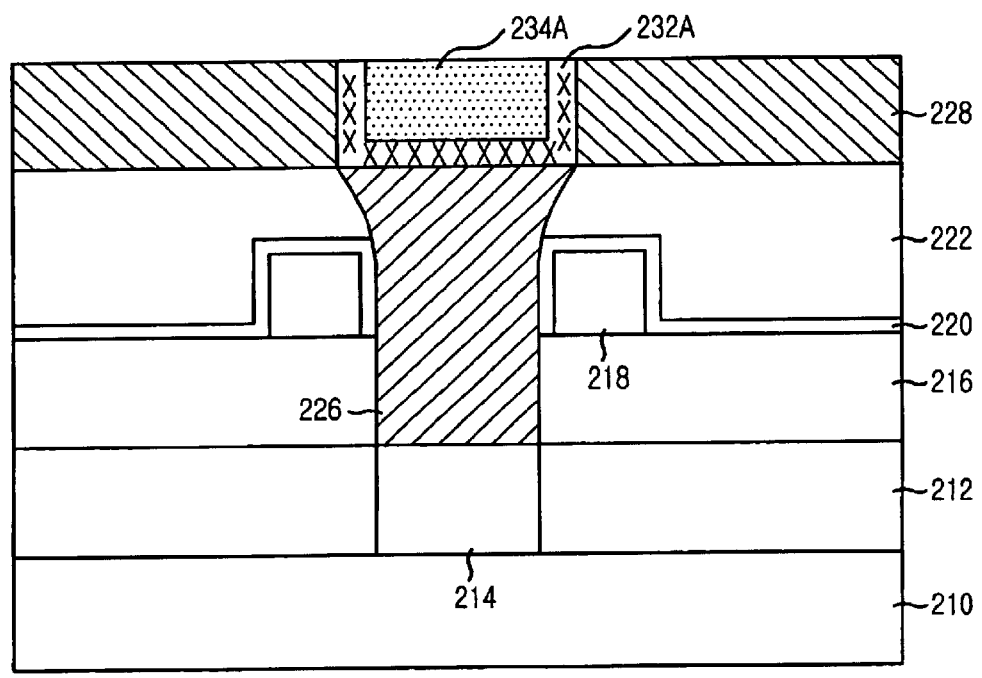

Thereafter, the conductive layer 232 is planarized using a method such as the etchback process or the CMP process till the top face of the sacrificial layer 228 is exposed, whereby the conductive layer 232 remains only in the concave region 229A thereof, as depicted in FIG. 4F. In the etchback process, $Cl_2$ and $BCl_3$ gas is used as basic gas for plasma gas. However, since it is necessary to use oxygen gas during the process for removing the sacrificial layer 228, it is preferable to add oxygen gas to $Cl_2$ and $BCl_3$ gas simultaneously in order to reduce the process time. Also, $SF_6/N_2$ gas can be used as basic gas for plasma gas, which is conventionally used for etching tungsten or tungsten silicide. Like using $Cl_2$ and $BCl_3$ gas as basic gas for the etchback process, it is preferable to use mixture gas of basic $SF_6/N_2$ gas and supplementary $O_2$ gas for reducing the process time.

Thereafter, the removal of the sacrificial layer 228 is carried out not using the conventional wet dip-out process but using a dry process by virtue of plasma. Here, since oxygen gas is good for removing low K dielectric layer, oxygen gas is utilized for plasma gas to remove the sacrificial layer 228. In this case, it is preferable that it should be to use $N_2$, $H_2$, $CF_4$ and $NF_3$ plasma gas with $O_2$ plasma gas for a surface treatment.

Figure 4G:
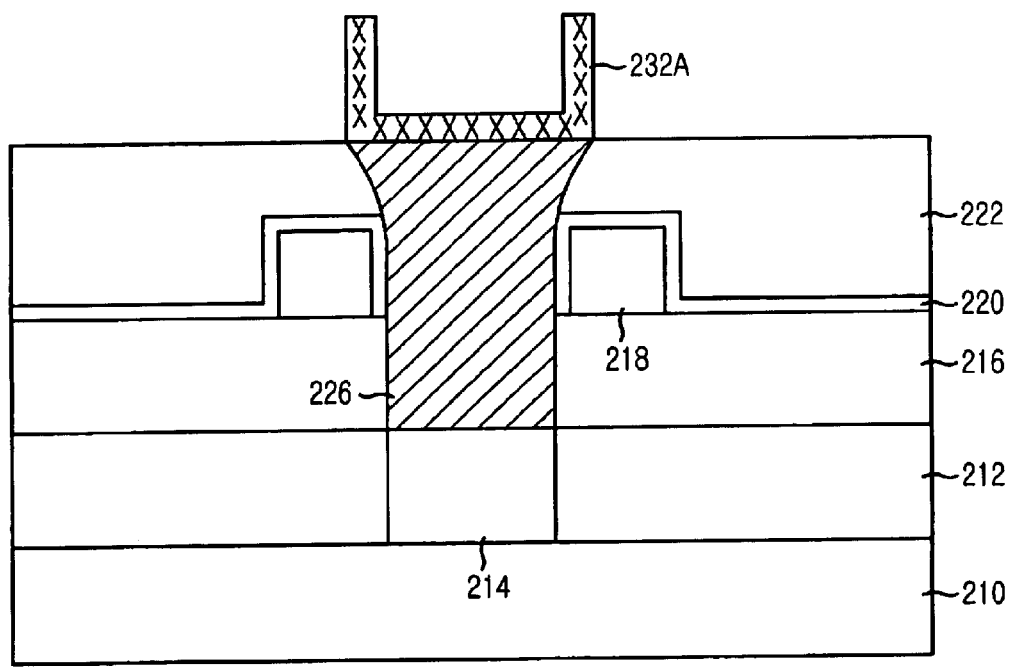

After finishing the process for removing the sacrificial layer 228, the residual photoresist 234A is removed by a dry strip process so that the bottom electrode manufactured by the inventive method is obtained as shown in FIG. 4G. That is, after the photoresist 234 is etched using $O_2/CF_4/H_2O/N_2$ or $O_2/N_2$, the residual photoresist 234A and the by-product produced in the etching step is rinsed out by means of solvent.

Subsequently, an annealing process may be carried out for recovering the deteriorated property of the bottom electrode 232A incurred during the etching step. At this time, impurity is cleared off using BOE solution before forming a dielectric layer on the bottom electrode 232A.

Meanwhile, in case of forming the bottom electrode 232A using a metastable polysilicon (MPS) process, the MPS grain can be grown up upon the inner side of the bottom electrode 232A in an ambient of a predetermined temperature and pressure after the depositing polysilicon on the bottom electrode 232A. After this, the top face of the bottom electrode 232A is planarized through the CMP process.

Finally, as is not shown in the drawing, a dielectric layer and a top electrode are formed on the bottom electrode subsequently.

In comparison with the prior art, polysilicon has been used for the hard mask in the prior art method because the oxidation layer is too strong to be patterned. Thus, it is difficult to use the photoresist as the mask. In addition, since it is possible to etch the oxidation layer by a physical attack of ions in plasma gas, the bottom region of the opening 229 is narrower than the top region of the opening 229. This phenomenon is called "Ion Shadowing Effect".

Therefore, in fabrication of the semiconductor device having minimal linewidth of 0.13 $\mu$m, double oxidation layer of phosphosilicate glass (PSG) and plasma enhanced TEOS (PE-TEOS) is utilized as the third insulating layer 222. Therefore, it is necessary to carry out the supplementary process for broadening the bottom region of the opening and removing the polysilicon hard mask.

In the present invention, however, the sacrificial layer 228 uses low k dielectric material which is not strong in comparison with the oxidation layer, whereby it is not necessary to use polysilicon as the hard mask. Additionally, it is easy to secure the bottom area of the opening 229 owing to the strong chemical characteristic in accordance with the present invention.

In the prior art method, the removal of the oxidation layer, i.e., the sacrificial layer 228, can be performed by the wet dip-out process. But, in the present invention, 02 plasma is utilized for removing the sacrificial layer 228 so that it is possible to overcome the shortage phenomenon between the adjacent bottom electrodes 232A caused by the surface tension during the wet dip-out process. Thus, it is possible to achieve a semiconductor capacitor with an enhanced electrical property.

As aforementioned, since the low k dielectric material is used as the sacrificial layer 228 for manufacturing the capacitor bottom electrode in the present invention, it is possible to abbreviate the process for forming the hard mask and the process for forming the etch stop layer so that the fabrication process can be simplified.

While the present invention has been described with respect to the particular embodiments, it will be apparent to those skilled in the art that various changes and modifications may be made without departing from the scope of the invention as defined in the following claims.

What is claimed is:

1. A method for manufacturing a capacitor bottom electrode of a semiconductor device, the method comprising the steps of:

a) preparing a semiconductor substrate;

b) forming a sacrificial layer of low k dielectric material on the semiconductor substrate;

c) forming a photoresist pattern on the sacrificial layer;

d) etching the sacrificial layer by using the photoresist pattern as an etching mask, thereby forming an opening;

e) depositing a conductive layer on sides and a bottom face of the opening and a top face of the sacrificial layer;

f) forming a photoresist on the conductive layer, wherein a concave region of the conductive layer is completely filled with the photoresist;

g) planarizing the conductive layer till the top face of the sacrificial layer is exposed; and h) forming a bottom electrode by removing the sacrificial layer enclosing the bottom electrode by using $O_2$ plasma with plasma gas selected from the group consisting of $N_2$, $H_2$, $CF_4$ and $NF_3$ and by removing a residual photoresist.

2. The method as recited in claim 1, wherein the conductive layer uses a material selected from the group consisting of tungsten, tungsten silicide, titanium nitride, polysilicon and the combination thereof by using an atomic layer deposition (ALD) method.

3. The method as recited in claim 1, wherein the step g) is carried out by using excited plasma having basic gas of $Cl_2$ and supplementary gas of $O_2$.

4. The method as recited in claim 1, wherein the step g) is carried out by using excited plasma having basic gas of $BCl_3$ and supplementary gas of $O_2$.

5. The method as recited in claim 1, wherein the step g) is carried out by using excited plasma having basic gas of $SF_6/N_2$ gas and supplementary gas of $O_2$.

6. The method as recited in claim 1, wherein the bottom electrode has a shape of cylindrical type.

7. A method for manufacturing a capacitor bottom electrode of a semiconductor device, the method comprising the steps of:

a) preparing a semiconductor substrate;

b) forming a sacrificial layer of low k dielectric material on the semiconductor substrate;

c) forming a photoresist pattern on the sacrificial layer;

d) etching the sacrificial layer by using the photoresist pattern as an etching mask, thereby forming an opening;

e) depositing a conductive layer on sides and a bottom face of the opening and a top face of the sacrificial layer;

f) forming a photoresist on the conductive layer, wherein a concave region of the conductive layer is completely filled with the photoresist;

g) planarizing the conductive layer till the top face of the sacrificial layer is exposed; and h) forming a bottom electrode by removing the sacrificial layer enclosing the bottom electrode by using $O_2$ plasma and by removing a residual photoresist, wherein the conductive layer uses a material selected from the group consisting of tungsten, tungsten suicide, titanium nitride, polysilicon and the combination thereof by using an atomic layer deposition (ALD) method.

8. The method as recited in claim 7, wherein the step h) is carried out by using $O_2$ plasma with plasma gas selected from the group consisting of $N_2$, $H_2$, $CF_4$ and $NF_3$.

9. The method as recited in claim 7, wherein the step g) is carried out by using excited plasma having basic gas of $Cl_2$ and supplementary gas of $O_2$.

10. The method as recited in claim 7, wherein the step g) is carried out by using excited plasma having basic gas of $BCl_3$ and supplementary gas of $O_2$.

11. The method as recited in claim 7, wherein the step g) is carried out by using excited plasma having basic gas of $SF_6/N_2$ gas and supplementary gas of $O_2$.

12. The method as recited in claim 7, wherein the bottom electrode has a shape of cylindrical type.

13. A method for manufacturing a capacitor bottom electrode of a semiconductor device, the method comprising the steps of:

a) preparing a semiconductor substrate;

b) forming a sacrificial layer of low k dielectric material on the semiconductor substrate;

c) forming a photoresist pattern on the sacrificial layer;

d) etching the sacrificial layer by using the photoresist pattern as an etching mask, thereby forming an opening;

e) depositing a conductive layer on sides and a bottom face of the opening and a top face of the sacrificial layer;

f) forming a photoresist on the conductive layer, wherein a concave region of the conductive layer is completely filled with the photoresist;

g) planarizing the conductive layer till the top face of the sacrificial layer is exposed; and h) forming a bottom electrode by removing the sacrificial layer enclosing the bottom electrode by using $O_2$ plasma and by removing a residual photoresist, wherein the step g) is carried out by using excited plasma having basic gas of $Cl_2$ and supplementary gas of $O_2$.

14. The method as recited in claim 13, wherein the step h) is carried out by using $O_2$ plasma with plasma gas selected from the group consisting of $N_2$, $H_2$, $CF_4$ and $NF_3$.

15. The method as recited in claim 13, wherein the conductive layer uses a material selected from the group consisting of tungsten, tungsten silicide, titanium nitride, polysilicon and the combination thereof by using an atomic layer deposition (ALD) method.

16. The method as recited in claim 13, wherein the step g) is carried out by using excited plasma having basic gas of $BCl_3$ and supplementary gas of $O_2$.

17. The method as recited in claim 13, wherein the step g) is carried out by using excited plasma having basic gas of $SF_6/N_2$ gas and supplementary gas of $O_2$.

18. The method as recited in claim 13, wherein the bottom electrode has a shape of cylindrical type.

* * * * *